(12) United States Patent
Hu et al.

(10) Patent No.: US 10,811,481 B2
(45) Date of Patent: Oct. 20, 2020

(54) OLED PANEL AND BRIGHTNESS COMPENSATION METHOD THEREOF, DISPLAY DEVICE

(71) Applicants: BEIJING BOE DISPLAY TECHNOLOGY CO., LTD., Beijing (CN); BOE TECHNLOGY GROUP CO., LTD., Beijing (CN)

(72) Inventors: Weipin Hu, Beijing (CN); Qianqian Bu, Beijing (CN); Yun Qiu, Beijing (CN); Congcong Wei, Beijing (CN); Sha Liu, Beijing (CN); Xiao Sun, Beijing (CN); Chun Wang, Beijing (CN); Mingxiao Jiang, Beijing (CN); Hebin Zhao, Beijing (CN); Lianjie Qu, Beijing (CN); Ruizhi Yang, Beijing (CN)

(73) Assignees: BEIJING BOE DISPLAY TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 48 days.

(21) Appl. No.: 16/235,194

(22) Filed: Dec. 28, 2018

(65) Prior Publication Data
US 2019/0214448 A1    Jul. 11, 2019

(30) Foreign Application Priority Data
Jan. 9, 2018    (CN) .......................... 2018 1 0017916

(51) Int. Cl.
*H01L 27/32* (2006.01)
*H01L 51/52* (2006.01)
*G09G 3/3208* (2016.01)

(52) U.S. Cl.
CPC ....... *H01L 27/3269* (2013.01); *G09G 3/3208* (2013.01); *H01L 27/3281* (2013.01); *H01L 51/5262* (2013.01); *G09G 2320/0233* (2013.01); *G09G 2320/0626* (2013.01); *G09G 2360/141* (2013.01); *G09G 2360/147* (2013.01)

(58) Field of Classification Search
None
See application file for complete search history.

(56) References Cited

U.S. PATENT DOCUMENTS

| | | | |
|---|---|---|---|
| 9,190,446 B1 * | 11/2015 | Chen | H01L 27/14616 |
| 2013/0194199 A1 * | 8/2013 | Lynch | G06F 3/0412 |
| | | | 345/173 |

FOREIGN PATENT DOCUMENTS

| | | |
|---|---|---|
| CN | 101382453 A | 3/2009 |
| CN | 103675987 A | 3/2014 |

(Continued)

OTHER PUBLICATIONS

First Office Action dated May 28, 2019 corresponding to Chinese application No. 201810017916.6.

*Primary Examiner* — Christopher J Kohlman
(74) *Attorney, Agent, or Firm* — Nath, Goldberg & Meyer; Joshua B. Goldberg

(57) ABSTRACT

The present disclosure provides an OLED panel comprising: a first substrate; an OLED device on the first substrate; an optical detecting device configured to detect a luminance of the OLED device; and a processor configured to generate a control signal according to brightness information of the OLED device detected by the optical detecting device so as to adjust brightness of the OLED device.

12 Claims, 1 Drawing Sheet

(56) References Cited

FOREIGN PATENT DOCUMENTS

| | | |
|---|---|---|
| CN | 104752445 A | 7/2015 |
| CN | 105095877 A | 11/2015 |
| CN | 106297679 A | 1/2017 |
| CN | 106405932 A | 2/2017 |
| CN | 206058222 U | 3/2017 |
| CN | 106887212 A | 6/2017 |
| CN | 107546337 A | 1/2018 |
| JP | 4736481 B2 | 7/2011 |

* cited by examiner

OLED PANEL AND BRIGHTNESS COMPENSATION METHOD THEREOF, DISPLAY DEVICE

CROSS-REFERENCE TO RELATED APPLICATION

This application claims the priority of China Patent Application No. 201810017916.6, filed on Jan. 9, 2018, entitled "OLED substrate and brightness compensation method thereof, display device", the entire contents of which are hereby incorporated by reference.

TECHNICAL FIELD

The present disclosure belongs to the field of display technologies, and in particular, to an OLED panel, a brightness compensation method thereof, and a display device.

BACKGROUND

OLED (Organic Light-Emitting Device, OLED for short) is a light-emitting device using an organic solid-state semiconductor as a light-emitting material, which has the advantages of a simple preparation process, low cost, low power consumption, high luminance, and wide range of temperature adaptation in operation and the like, which make it have broad application prospects.

Generally, since OLED panels operate in a high-contrast, high-brightness state for a long time, the OLED devices deteriorate inconsistently, and the luminance also declined inconsistently. Therefore, the OLED panel is unevenly illuminated, so that the OLED pixels need to be compensated for brightness. Such compensation is usually carried out by professional equipment at the factory, and it cannot be compensated by the user, and it is not real-time.

Therefore, providing an OLED panel that can compensate brightness of the OLED device in real-time is a technical problem to be solved.

SUMMARY

The present disclosure provides an OLED panel comprising: a first substrate, and an OLED device on the first substrate, wherein the OLED panel further comprises: an optical detecting device, which is configured to detect a luminance of the OLED device; and a processor, which is configured to generate a control signal according to brightness information of the OLED device detected by the optical detecting device so as to adjust brightness of the OLED device.

Optionally, the optical detecting device has a plurality of photoelectric sensors, the OLED device has a plurality of pixel groups, each of the plurality of photoelectric sensors is corresponding to each of the plurality of pixel groups respectively.

Optionally, the processor comprises: a data processor, which is configured to generate the control signal according to brightness information of the OLED device detected by the optical detecting device; and an illumination controller, which is configured to adjust brightness of the OLED device according to the control signal.

Optionally, the optical detecting device is a transparent optical device located on a luminous-surface side of the OLED device, and an orthographic projection of the optical detecting device on the first substrate is at least partially coincident with an orthographic projection of the OLED device on the first substrate.

Optionally, the orthographic projection of the optical detecting device on the first substrate covers the orthographic projection of the OLED device on the first substrate.

Optionally, the optical detecting device comprises a PIN photoelectric conversion device made of graphene or a-Si as an intrinsic layer.

Optionally, the optical detecting device is disposed on a second substrate; the second substrate on which the optical detecting device is formed is disposed opposite to the first substrate on which the OLED device is formed.

Optionally, the OLED panel further comprises a second substrate disposed opposite to the first substrate, and a semi-transflective membrane is disposed on the second substrate; wherein a part of light emitted by the OLED device passes through the semi-transflective membrane, and another part of light is reflected by the semi-transflective membrane to the optical detecting device.

Optionally, an angle between a plane of the semi-transflective membrane and an extending direction of a plane of the first substrate is 45°.

Optionally, an orthographic projection of the optical detecting device on the first substrate does not overlap with an orthographic projection of the OLED device on the first substrate.

Optionally, the optical detecting device is disposed on the first substrate and alternately disposed with the OLED device; the OLED panel further comprises a light guide plate; wherein light emitted by the OLED device is conducted to the optical detecting device via the light guide plate.

Optionally, a first luminous dot is disposed opposite to the optical detecting device, on a side of the light guide plate facing the first substrate.

Optionally, a second luminous dot is disposed on a side of the light guide plate facing away from the first substrate.

The present disclosure also provides a brightness compensation method of an OLED panel, wherein the OLED panel comprises: a first substrate, and an OLED device on the first substrate, wherein the OLED panel further comprises: an optical detecting device configured to detect a luminance of the OLED device; and a processor configured to generate a control signal according to brightness information of the OLED device detected by the optical detecting device so as to adjust brightness of the OLED device, wherein the brightness compensation method comprises: detecting the luminance of the OLED device by the optical detecting device; and generating the control signal by the processor according to brightness information of the OLED device detected by the optical detecting device, and adjusting brightness of the OLED device according to the control signal.

The present disclosure further provides a display device comprising an OLED panel, wherein the OLED panel comprises: a first substrate; an OLED device on the first substrate; an optical detecting device configured to detect a luminance of the OLED device; and a processor configured to generate a control signal according to brightness information of the OLED device detected by the optical detecting device so as to adjust brightness of the OLED device.

DETAILED DESCRIPTION OF THE EMBODIMENTS

The present disclosure will be further described in detail below in conjunction with the drawings and specific embodiments.

Example 1

Figure 1:
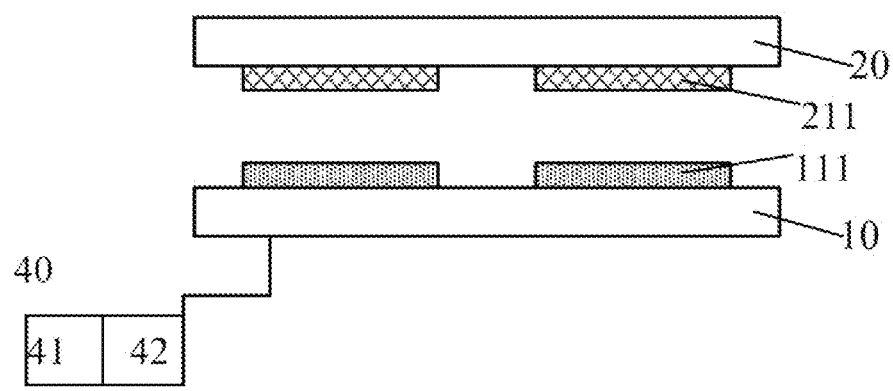
FIG. 1 is a schematic structural diagram of an OLED panel according to an embodiment of the present disclosure.
Figure 2:
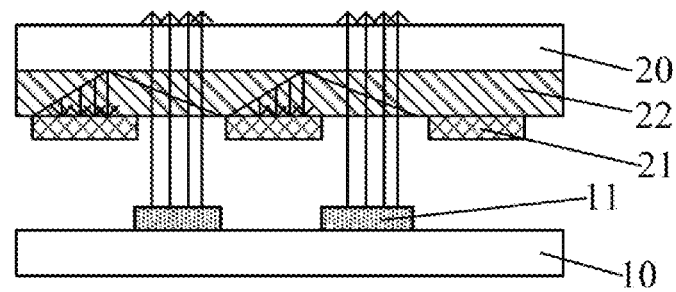
FIG. 2 is a schematic structural diagram of an OLED panel according to an embodiment of the present disclosure.
Figure 3:
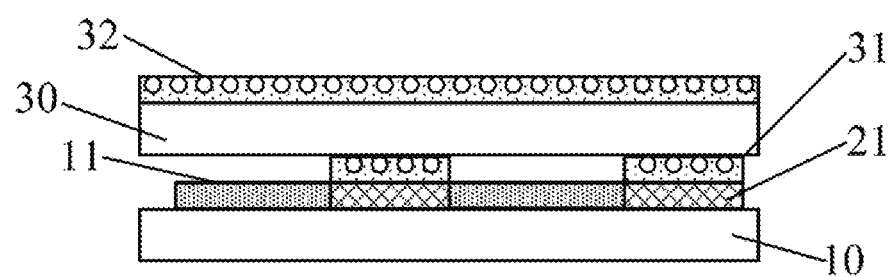
FIG. 3 is a schematic structural diagram of an OLED panel according to an embodiment of the present disclosure.

According to FIGS. 1-3, the present example provides an OLED panel comprising: a first substrate 10, an OLED device 11 on the first substrate 10, an optical detecting device 21, and a processor 40. The optical detecting device 21 is configured to detect a luminance of the OLED device 11. The processor 40 is configured to generate a control signal according to brightness information of the OLED device 11 detected by the optical detecting device 21, so as to adjust brightness of the OLED device 11.

Since the optical detecting device 21 is disposed in the OLED panel of the present example, the luminance (light-emitting brightness) of the OLED device 11 can be detected in real-time by the optical detecting device 21, and then the control signal is generated by the processor 40 according to the brightness information of the OLED device 11 detected by the optical detecting device 21, by which the brightness of the OLED device 11 is adjusted to make the display on the OLED panel uniform.

According to the structure of the OLED panel described above, a brightness compensation method of the OLED panel is also provided in the example, that is, the luminance of the OLED device in the OLED panel is compensated, and the method specifically includes the following steps:

Step 1: detecting the luminance of the OLED device by the optical detecting device;

Step 2: generating the control signal by the processor according to brightness information of the OLED device detected by the optical detecting device; and Step 3: adjusting brightness of the OLED device by the processor according to the control signal.

In this way, the light-emitting brightness of the OLED device can be compensated in real-time by using the above three steps, thereby making the display of the OLED panel more uniform.

As shown in FIG. 1, the optical detecting device 21 may have a plurality of photoelectric sensors 211, and the OLED device 11 has a plurality of pixel groups 111. Each of the plurality of photoelectric sensors 211 is corresponding to each of the plurality of pixel groups 111 respectively. It should be understood that the pixel group herein is a group consisting of one pixel or a plurality of pixels. Therefore, compared to an external brightness compensation method that conventionally photographs the entire panel by CCD and then establishes a correct model for each pixel, the OLED panel of the present disclosure can compensate luminance of each pixel group individually in a simple manner.

As shown in FIG. 1, the processor may comprise: a data processor 41, which is configured to generate the control signal according to brightness information of the OLED device 11 detected by the optical detecting device 21; and an illumination controller 42, which is configured to adjust brightness of the OLED device 11 according to the control signal. It should be understood that the data processor 41 may be provided integrally with the illumination controller 42 or may be provided separately.

Hereinafter, the OLED panel in this example will be described in conjunction with the following three specific implementations.

In the first implementation, as shown in FIG. 1, the optical detecting device 21 is a transparent optical device located on a luminous-surface side of the OLED device 11, and an orthographic projection of the optical detecting device 21 on the first substrate 10 is at least partially coincident with an orthographic projection of the OLED device 11 on the first substrate 10. In this way, the light emitted by the OLED device 11 can be directly irradiated onto the transparent optical device, and the transparent optical device can output the detected brightness information to the data processor, and the data processor can generate the control signal according to the brightness information. The illumination controller is controlled by the control signal to adjust the brightness of the OLED device 11, that is, the brightness compensation of the OLED device 11 is realized, so that the display brightness of the display panel is uniform.

In order to more accurately detect the light-emitting brightness of the OLED device 11, the transparent optical device is disposed opposite to the OLED device 11, and the orthographic projection of the optical detecting device 21 on the first substrate 10 covers the orthographic projection of the OLED device 11 on the first substrate 10. Alternatively, the orthographic projection of the optical detecting device 21 on the first substrate 10 overlaps with the orthographic projection of the OLED device 11 on the first substrate 10.

The transparent optical device comprises a PIN photoelectric conversion device made of transparent graphene or a-Si as an intrinsic layer. Definitely, other optical detecting devices 21 can also be used to detect the brightness information of the OLED device 11.

Optionally, the optical detecting device 21 is disposed on a second substrate 20. The second substrate 20 on which the optical detecting device 21 is formed is disposed opposite to the first substrate 10 on which the OLED device 11 is formed. Definitely, the optical detecting device 21 may also be disposed on the first substrate 10, and the OLED device 11 may be disposed on the second substrate as long as the optical detecting device 21 is disposed opposite to the OLED device 11.

In the second implementation, as shown in FIG. 2, whether the optical detecting device 21 is a transparent optical device or not is not required for the OLED panel. In this OLED panel, not only the first substrate 10 but also the second substrate 20 is provided, and the second substrate 20 is provided with a semi-transflective membrane 22. The optical detecting device 21 and the OLED device 11 are disposed on the first substrate 10, and a part of light emitted by the OLED device 11 passes through the semi-transflective membrane 22, and another part of light is reflected by the semi-transflective membrane 22 to the optical detecting device 21. In this way, the optical detecting device 21 detects the brightness information of the light reflected by the semi-transflective membrane 22 received by the optical detecting device 21, and outputs the brightness information to the data processor. At this time, the data processor can generate the control signal according to the brightness information, and control the illumination controller by the control signal to adjust the brightness of the OLED device 11, that is, the brightness compensation of the OLED device 11 is realized, so that the display brightness of the display panel is uniform.

The semi-transflective membrane 22 has a certain angle between the plane thereof and an extending direction of a plane of the first substrate 10, and the angle is preferably 45°. Specifically, when the angle is 45°, after the light of the OLED device 11 reaches the transflective membrane 22, a part of the light is emitted vertically, a part of the light is reflected horizontally, and the horizontal-reflected part is reflected to the optical detecting device 21. If the angle is not set to be 45°, it is desired that a part of the light is emitted vertically and a part of the light is directly reflected to the optical detecting device 21 after the light of the OLED device 11 reaches the transflective membrane 22.

The orthographic projection of the optical detecting device 21 on the first substrate 10 may not overlap with the orthographic projection of the OLED device 11 on the first substrate. That is, the optical detecting device 21 and the OLED device 11 are misaligned with each other. With such an arrangement, the light emission of the OLED device 11 is not affected, so that the display effect of the OLED panel is good.

In the third implementation, as shown in FIG. 3, the optical detecting device 21 in the OLED panel is also disposed on the first substrate 10 and alternately disposed with the OLED device 11. The OLED panel further comprises a light guide plate 30. Light emitted by the OLED device 11 is conducted to the optical detecting device 21 via the light guide plate 30. The optical detecting device 21 detects the brightness information of the light irradiated thereon by the light guide plate 30, and outputs the brightness information to the data processor, and the data processor can generate the control signal according to the brightness information, and the illumination controller is controlled by the control signal to adjust the brightness of the OLED device 11, that is, the brightness compensation of the OLED device 11 is realized, so that the display brightness of the display panel is uniform.

Optionally, a first luminous dot 31 is disposed opposite to the optical detecting device 21, on a side of the light guide plate 30 facing the first substrate 10. The light incident on the light guide plate and reflected onto the optical detecting device 21 is scattered by the first luminous dot 31, so as to make the light received by the optical detecting device 21 more uniform, which is contribute to prolonging the service life of the optical detecting device 21.

Optionally, the OLED panel further comprises a second luminous dot 32. The second luminous dot 32 is disposed on a side of the light guide plate 30 facing away from the first substrate 10. In this way, the light emitted by the OLED device 11 on the first substrate 10 can be dissipated by the second luminous dot 32, which can make the OLED panel display more uniform.

Example 2

The present example provides a display device comprising an OLED panel described above in the Example 1. Therefore, the display device of the example has a better display effect.

The display device may be a liquid crystal display device or an electroluminescence display device, a product or part such as a liquid crystal panel, an electronic paper, an OLED panel, a mobile phone, a tablet computer, a television, a display, a laptop, a digital photo frame, a navigator and the like having display function.

It should be understood that the above embodiments are merely exemplary embodiments employed to explain the principles of the present disclosure, but the present disclosure is not limited thereto. Various modifications and improvements can be made by those skilled in the art without departing from the spirit and scope of the disclosure, and such modifications and improvements are also considered to be within the scope of the disclosure.

The invention claimed is:

1. An OLED panel comprising: a first substrate, and an OLED device on the first substrate, wherein the OLED panel further comprises:
    an optical detecting device, which is configured to detect a luminance of the OLED device; and
    a processor, which is configured to generate a control signal according to brightness information of the OLED device detected by the optical detecting device so as to adjust brightness of the OLED device,
    wherein the optical detecting device has a plurality of photoelectric sensors, the OLED device has a plurality of pixel groups, each of the plurality of photoelectric sensors is corresponding to each of the plurality of pixel groups respectively,
    wherein the processor comprises:
    a data processor, which is configured to generate the control signal according to brightness information of the OLED device detected by the optical detecting device; and
    an illumination controller, which is configured to adjust brightness of the OLED device according to the control signal,
    wherein the OLED panel further comprises a second substrate disposed opposite to the first substrate, and a semi-transflective membrane is disposed on the second substrate; wherein a part of light emitted by the OLED device passes through the semi-transflective membrane, and another part of light is reflected by the semi-transflective membrane to the optical detecting device.

2. The OLED panel according to claim 1, wherein the optical detecting device is a transparent optical device located on a luminous-surface side of the OLED device, and an orthographic projection of the optical detecting device on the first substrate is at least partially coincident with an orthographic projection of the OLED device on the first substrate.

3. The OLED panel according to claim 2, wherein the orthographic projection of the optical detecting device on the first substrate covers the orthographic projection of the OLED device on the first substrate.

4. The OLED panel according to claim 1, wherein the optical detecting device comprises a PIN photoelectric conversion device made of graphene or a-Si as an intrinsic layer.

5. The OLED panel according to claim 4, wherein the optical detecting device is disposed on a second substrate; the second substrate on which the optical detecting device is formed is disposed opposite to the first substrate on which the OLED device is formed.

6. The OLED panel according to claim 1, wherein an angle between a plane of the semi-transflective membrane and an extending direction of a plane of the first substrate is 45°.

7. The OLED panel according to claim 6, wherein an orthographic projection of the optical detecting device on the first substrate does not overlap with an orthographic projection of the OLED device on the first substrate.

8. The OLED panel according to claim 1, wherein the optical detecting device is disposed on the first substrate and alternately disposed with the OLED device; the OLED panel further comprises a light guide plate; wherein light emitted by the OLED device is conducted to the optical detecting device via the light guide plate.

9. The OLED panel according to claim 8, wherein a second luminous dot is disposed opposite to the optical detecting device, on a side of the light guide plate facing the first substrate.

10. The OLED panel according to claim 8, wherein a second luminous dot is disposed on a side of the light guide plate facing away from the first substrate.

11. A brightness compensation method of an OLED panel according to claim 1,
wherein the brightness compensation method comprises:
detecting the luminance of the OLED device by the optical detecting device; and
generating the control signal by the processor according to brightness information of the OLED device detected by the optical detecting device, and adjusting brightness of the OLED device according to the control signal.

12. A display device comprising an OLED panel according to claim 1.

* * * * *